(12) United States Patent
Haratsch et al.

(10) Patent No.: US 8,634,250 B2
(45) Date of Patent: Jan. 21, 2014

(54) METHODS AND APPARATUS FOR PROGRAMMING MULTIPLE PROGRAM VALUES PER SIGNAL LEVEL IN FLASH MEMORIES

(75) Inventors: Erich F. Haratsch, Bethlehem, PA (US); Milos Ivkovic, Sunnyvale, CA (US); Victor Krachkovsky, Allentown, PA (US); Nenad Miladinovic, Campbell, CA (US); Andrei Vityaev, San Jose, CA (US); Johnson Yen, Fremont, CA (US)

(73) Assignee: LSI Corporation, San Jose, CA (US)

( * ) Notice: Subject to any disclaimer, the term of this patent is extended or adjusted under 35 U.S.C. 154(b) by 179 days.

(21) Appl. No.: 13/001,295

(22) PCT Filed: Jul. 21, 2009

(86) PCT No.: PCT/US2009/051314
§ 371 (c)(1),
(2), (4) Date: Feb. 25, 2011

(87) PCT Pub. No.: WO2010/011692
PCT Pub. Date: Jan. 28, 2010

(65) Prior Publication Data
US 2011/0141808 A1 Jun. 16, 2011

Related U.S. Application Data

(60) Provisional application No. 61/135,732, filed on Jul. 22, 2008, provisional application No. 61/194,751, filed on Sep. 30, 2008.

(51) Int. Cl.
*G11C 11/34* (2006.01)

(52) U.S. Cl.
USPC ............. 365/185.22; 365/185.28; 365/185.19

(58) Field of Classification Search
USPC .............. 365/185.22, 185.18, 185.19, 185.28
See application file for complete search history.

(56) References Cited

U.S. PATENT DOCUMENTS

| | | | | |
|---|---|---|---|---|
| 6,975,537 B2 * | 12/2005 | Lutze et al. | ............... | 365/185.18 |
| 6,996,004 B1 * | 2/2006 | Fastow et al. | ............ | 365/185.03 |
| 7,257,032 B2 | 8/2007 | Fujiu et al. | | |
| 7,414,887 B2 * | 8/2008 | Guterman et al. | ........ | 365/185.05 |
| 2005/0128810 A1 | 6/2005 | Lutze et al. | | |
| 2007/0189073 A1 | 8/2007 | Aritome | | |
| 2008/0019188 A1 | 1/2008 | Li | | |

FOREIGN PATENT DOCUMENTS

EP 1 271 553 1/2003

* cited by examiner

*Primary Examiner* — Son Dinh
(74) *Attorney, Agent, or Firm* — Ryan, Mason & Lewis, LLP

(57) ABSTRACT

Methods and apparatus are provided for programming multiple program values per signal level in flash memories. A flash memory device having a plurality of program values is programmed by programming the flash memory device for a given signal level, wherein the programming step comprises a programming phase and a plurality of verify phases. In another variation, a flash memory device having a plurality of program values is programmed, and the programming step comprises a programming phase and a plurality of verify phases, wherein at least one signal level comprises a plurality of the program values. The signal levels or the program values (or both) can be represented using one or more of a voltage, a current and a resistance.

50 Claims, 13 Drawing Sheets

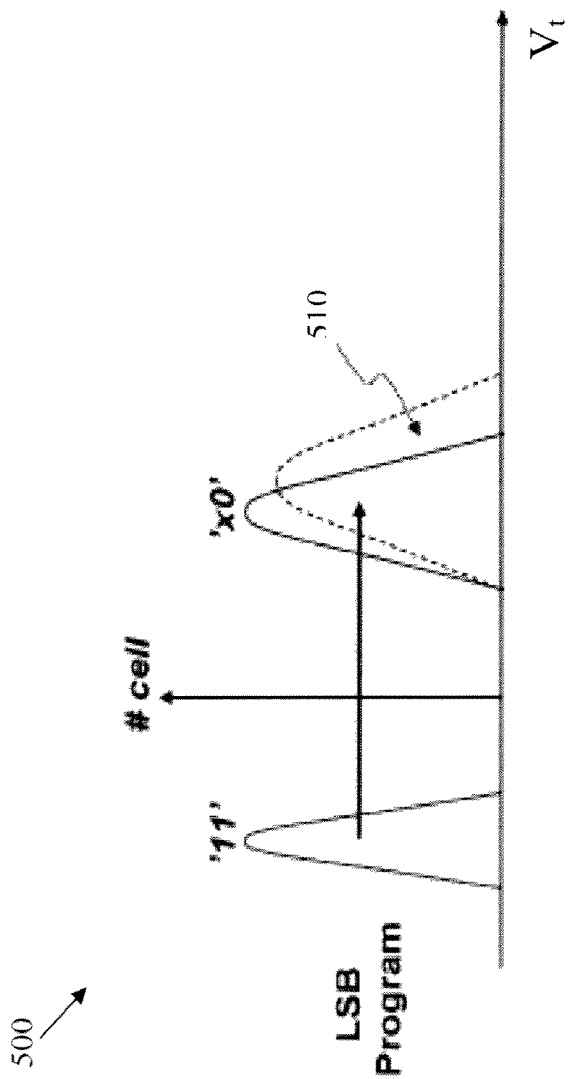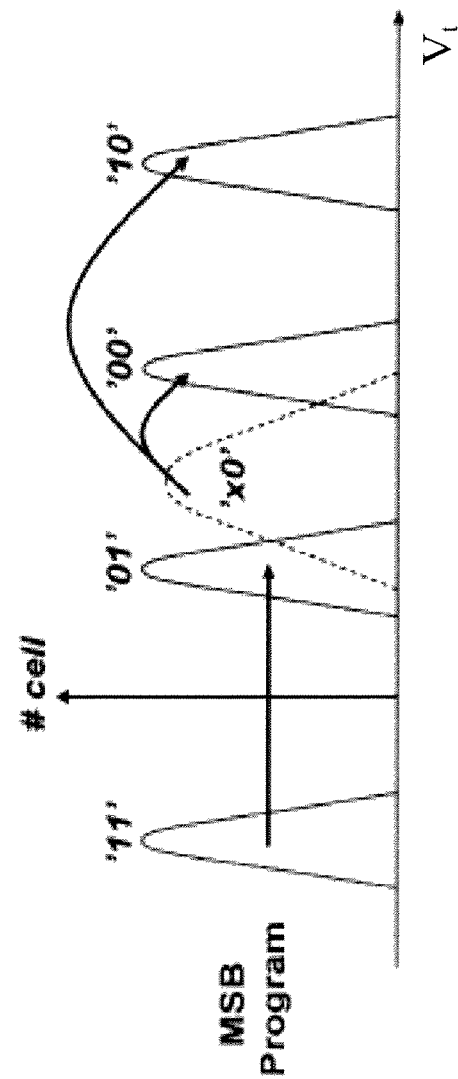

METHODS AND APPARATUS FOR PROGRAMMING MULTIPLE PROGRAM VALUES PER SIGNAL LEVEL IN FLASH MEMORIES

CROSS-REFERENCE TO RELATED APPLICATIONS

The present application claims priority to U.S. Provisional Patent Application Ser. No. 61/135,732, filed Jul. 22, 2008; and U.S. Provisional Patent Application Ser. No. 61/194,751, filed Sep. 30, 2008, each incorporated by reference herein.

The present application is related to International Patent Application Serial No. PCT/US09/36810, filed Mar. 11, 2009, entitled "Methods and Apparatus for Storing Data in a Multi-Level Cell Flash Memory Device with Cross-Page Sectors, Multi-Page Coding and Per-Page Coding," and International Patent Application Serial No. PCT/US09/49326, entitled "Methods and Apparatus for Read-Side Intercell Interference Mitigation in Flash Memories;" International Patent Application Serial No. PCT/US09/49327, entitled "Methods and Apparatus for Write-Side Intercell Interference Mitigation in Flash Memories;" International Patent Application Serial No. PCT/US09/49328, entitled "Methods and Apparatus for Interfacing Between a Flash Memory Controller and a Flash Memory Array;" International Patent Application Serial No. PCT/US09/49330, entitled "Methods and Apparatus for Intercell Interference Mitigation Using Modulation Coding;" and International Patent Application Serial No. PCT/US09/49333, entitled "Methods and Apparatus for Soft Demapping and Intercell Interference Mitigation in Flash Memories," each filed Jun. 30, 2009 and incorporated by reference herein.

FIELD OF THE INVENTION

The present invention relates generally to flash memory devices and more particularly, to improved techniques for programming multiple program values per signal level in such flash memory devices.

BACKGROUND OF THE INVENTION

A number of memory devices, such as flash memory devices, use analog memory cells to store data. Each memory cell stores an analog value, also referred to as a storage value, such as an electrical charge or voltage. The storage value represents the information stored in the cell. In flash memory devices, for example, each analog memory cell typically stores a certain voltage. The range of possible analog values for each cell is typically divided into threshold regions, with each region corresponding to one or more data bit values. Data is written to an analog memory cell by writing a nominal analog value that corresponds to the desired one or more bits.

Single-level cell (SLC) flash memory devices, for example, store one bit per memory cell (or two possible memory states). Multi-level cell (MLC) flash memory devices, on the other hand, store two or more bits per memory cell (i.e., each cell has four or more programmable states). For a more detailed discussion of MLC flash memory devices, see, for example, International Patent Application Serial No. PCT/US09/36810, filed Mar. 11, 2009, entitled "Methods and Apparatus for Storing Data in a Multi-Level Cell Flash Memory Device with Cross-Page Sectors, Multi-Page Coding and Per-Page Coding," incorporated by reference herein.

In multi-level NAND flash memory devices, for example, floating gate devices are employed with programmable threshold voltages in a range that is divided into multiple intervals with each interval corresponding to a different multibit value. To program a given multibit value into a memory cell, the threshold voltage of the floating gate device in the memory cell is programmed into the threshold voltage interval that corresponds to the value.

The analog values stored in memory cells are often distorted. The distortions are typically due to, for example, back pattern dependency (BPD), noise and intercell interference (ICI). For a more detailed discussion of distortion in flash memory devices, see, for example, J. D. Lee et al., "Effects of Floating-Gate Interference on NAND Flash Memory Cell Operation," IEEE Electron Device Letters, 264-266 (May 2002) or Ki-Tae Park, et al., "A Zeroing Cell-to-Cell Interference Page Architecture With Temporary LSB Storing and Parallel MSB Program Scheme for MLC NAND Flash Memories," IEEE J. of Solid State Circuits, Vol. 43, No. 4, 919-928, (April 2008), each incorporated by reference herein.

A number of techniques have been proposed or suggested for mitigating the effect of ICI and such other distortions. For example, Ki-Tae Park, et al. describe existing programming techniques, such as even/odd programming, bottom up programming and multi-stage programming that mitigate ICI. While these existing methods have helped to reduce the effect of ICI and other distortions, they become less effective as transistor sizes are reduced, for example, below 65 nm technologies, where parasitic capacitances are much larger due to the close proximity of flash cells.

International Patent Application Serial No. PCT/US09/49327, entitled "Methods and Apparatus for Write-Side Intercell Interference Mitigation in Flash Memories," discloses write-side intercell interference mitigation techniques. A flash memory device is programmed by obtaining program data to be written to at least one target cell in the flash memory and at least one aggressor cell to be programmed later than the target cell. Precompensated program values are computed that precompensate for the intercell interference on the target cell. The aggressor cells comprise one or more cells that are adjacent to the target cell. A need still exists for improved techniques for writing the precompensated program values or other values associated with multiple threshold voltages to the flash memory array.

SUMMARY OF THE INVENTION

Generally, methods and apparatus are provided for programming multiple program values per signal level in flash memories. According to one aspect of the invention, a flash memory device having a plurality of program values is programmed by programming the flash memory device for a given signal level, wherein the programming step comprises a programming phase and a plurality of verify phases. The programming step can be repeated until all cells for a given signal level are programmed. In addition, the programming step can be repeated for one or more additional signal levels.

According to another aspect of the invention, a flash memory device having a plurality of program values is programmed, and the programming step comprises a programming phase and a plurality of verify phases, wherein at least one signal level comprises a plurality of the program values. The programming step can be repeated until all cells are programmed. The signal levels or the program values (or both) can be represented using one or more of a voltage, a current and a resistance.

Each of the program values is associated with one of a plurality of disjoint groups. In one variation, each of the disjoint groups corresponds to a signal level. In another variation, at least two of the disjoint groups comprise a different number of members. In yet another variation, a number of the disjoint groups corresponds to a number of signal levels in the flash memory device.

In one exemplary implementation, the plurality of program values comprise program values that precompensate for one or more of intercell interference, back pattern dependency, program disturb, read disturb and additional noise. For example, the plurality of program values can correspond to precompensated program values that compensate for disturbance, such as intercell interference from at least one aggressor cell. A number of optional simplifications are disclosed for compensating for the disturbance with reduced complexity.

A more complete understanding of the present invention, as well as further features and advantages of the present invention, will be obtained by reference to the following detailed description and drawings.

BRIEF DESCRIPTION OF THE DRAWINGS

FIGS. 5A and 5B, collectively, illustrate an alternative MLC programming scheme that reduces the ICI inflicted on neighboring cells;

DETAILED DESCRIPTION

Various aspects of the present invention are directed to signal processing techniques for mitigating ICI in memory devices, such as single-level cell or multi-level cell (MLC) NAND flash memory devices. As used herein, a multi-level cell flash memory comprises a memory where each memory cell stores two or more bits. Typically, the multiple bits stored in one flash cell belong to different pages. While the invention is illustrated herein using memory cells that store an analog value as a voltage, the present invention can be employed with any storage mechanism for flash memories, such as the use of voltages, currents or resistances to represent stored data states, as would be apparent to a person of ordinary skill in the art.

Figure 1:
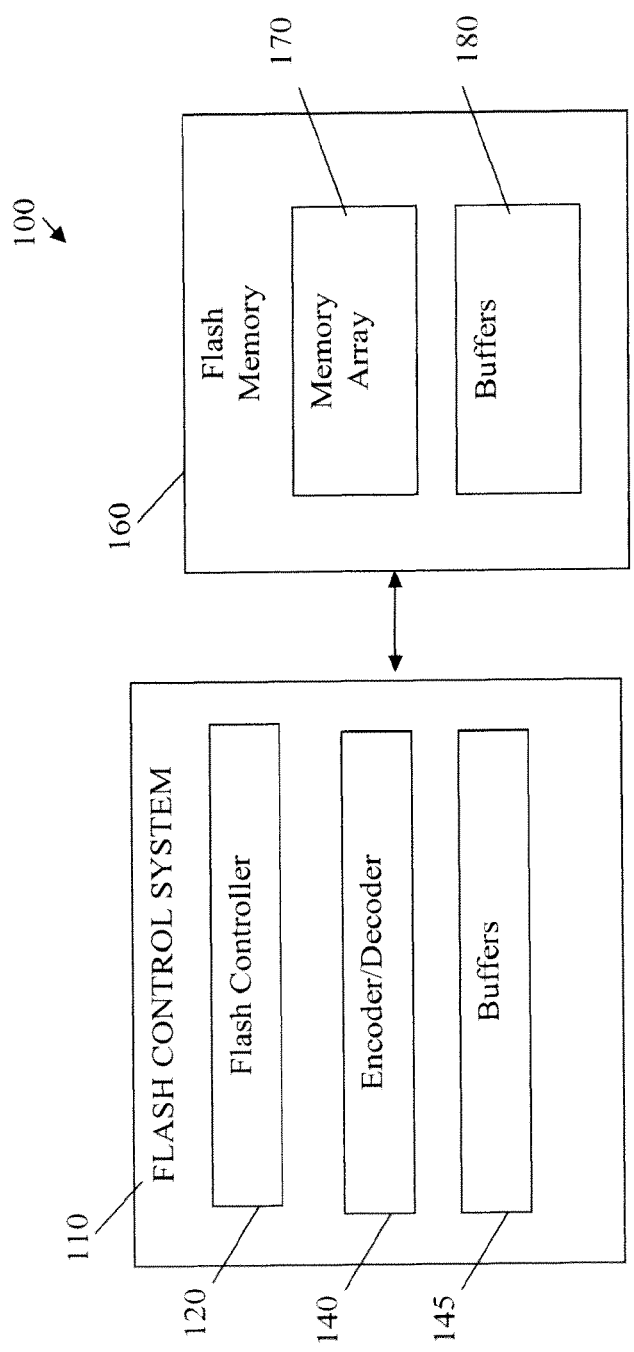
FIG. 1 is a schematic block diagram of a conventional flash memory system.

FIG. 1 is a schematic block diagram of a conventional flash memory system 100. As shown in FIG. 1, the exemplary flash memory system 100 comprises a flash control system 110 and a flash memory block 160. The exemplary flash control system 110 comprises a flash controller 120, an encoder/decoder block 140 and one or more buffers 145. In an alternative embodiment, the encoder/decoder block 140 and some buffers 145 may be implemented inside the flash controller 120. The encoder/decoder block 140 and buffers 145 may be implemented, for example, using well-known commercially available techniques and/or products.

The exemplary flash memory block 160 comprises a memory array 170 and one or more buffers 180 that may each be implemented using well-known commercially available techniques and/or products. The memory array 170 may be embodied as a single-level or multi-level cell flash memory, such as a NAND flash memory, a phase-change memory (PCM), an MRAM memory, a NOR flash memory or another non-volatile flash memory. While the invention is illustrated primarily in the context of a multi-level cell NAND flash memory, the present invention can be applied to single-level cell flash memories and other non-volatile memories as well, as would be apparent to a person of ordinary skill in the art.

Multi-Level Cell Flash Memory

Figure 2:
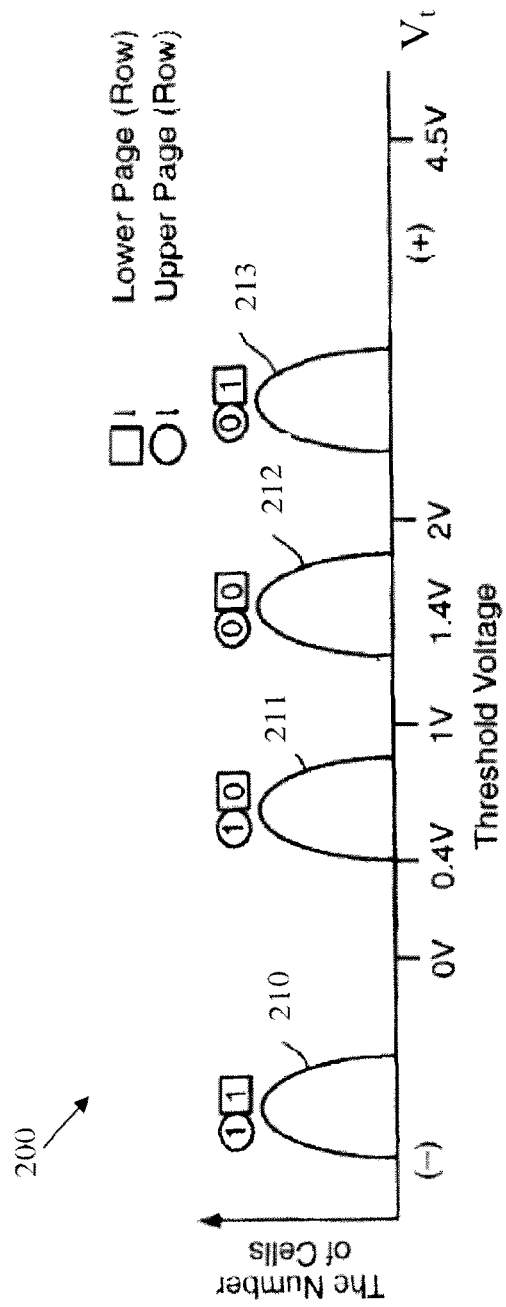
FIG. 2 illustrates an exemplary threshold voltage distribution for the exemplary multi-level cell flash memory of FIG. 1.

In a multi-level cell NAND flash memory, a threshold detector is typically employed to translate the voltage value associated with a particular cell to a predefined memory state. FIG. 2 illustrates an exemplary threshold voltage distribution for the exemplary multi-level cell flash memory 170 of FIG. 1, based on the teachings of U.S. Pat. No. 6,522,580, incorporated by reference herein. Generally, the threshold voltage of a cell is the voltage that needs to be applied to the cell no that the cell conducts a certain amount of current. The threshold voltage is a measure for the data stored in a cell.

In the exemplary embodiment shown in FIG. 2, each storage element employs four possible data states to store two bits of data in each memory cell. FIG. 2 illustrates four peaks 210-213, with each peak corresponding to one state. In a multi-level cell flash device, the different peaks 210-213 of the threshold voltage distribution graph 200 are used for storing two bits in the cell.

The peaks 210-213 of the threshold voltage distribution graph 200 are labeled with corresponding binary values. Thus, when a cell is in a first state 210, it represents a "1" for the lower bit (also known as least significant bit, LSB) and a "1" for the upper bit (also known as most significant bit. MSB). State 210 is generally the initial unprogrammed or erased state of the cell. Likewise, when a cell is in the second state 211, it represents a "0" for the lower bit and a "1" for the upper bit. When a cell is in the third state 212, it represents a "0" for the lower bit and a "0" for the upper bit. Finally, when a cell is in the fourth state 213, it represents a "1" for the lower bit and a "0" for the upper bit.

Threshold voltage distribution 210 represents a distribution of the threshold voltages $V_t$ of the cells within the array that are in an erased state ("11" data state), with negative threshold voltage levels below 0 volts. Threshold voltage distributions 211 and 212 of memory cells storing "10" and "00" user data, respectively, are shown to be between 0 and 1 volts and between 1 and 2 volts, respectively. Threshold voltage distribution 213 shows the distribution of cells that have been programmed to the "01" data state, with a threshold voltage level set between 2 and 4.5 volts of the read pass voltage.

Thus, in the exemplary embodiment of FIG. 2, 0 volts, 1 volt and 2 volts can be used as voltage level thresholds between each level or state. The voltage level thresholds are used by the flash memory 160 (e.g., sensing circuits in the flash memory 160) to determine the voltage level or state of a given cell. The flash memory 160 will assign one or more bits to each cell based on a comparison of the measured voltages to the voltage level thresholds, which are then transmitted as hard decisions to the flash control system 110. In addition or alternatively, in an implementation using soft information, the flash memory 160 may transmit the measured voltages or a quantized version of the measured voltages to the flash control system 110 as soft information, where a larger number of bits is used to represent the measured voltage than the number of bits stored in the memory cell.

It is further noted that cells are typically programmed using well-known ISPP (Incremental Step Pulse Programming) and Program/Verify techniques. For a discussion of ISPP and Program/Verify techniques, see, for example, United States Patent Application Publication No. 2008/0084751; Ki-Tae Park, et al., "A Zeroing Cell-to-Cell Interference Page Architecture With Temporary LSB Storing and Parallel MSB Program Scheme for MLC NAND Flash Memories," IEEE J. of Solid State Circuits, Vol. 43. No. 4, 919-928, (April 2008); T.-S. Jung, "A 117-mm$^2$ 3.3-V only 128-Mb Multilevel NAND Flash Memory for Mass Storage Applications," IEEE J. of Solid State Circuits, vol. 31, No. 11, 1575-1583, (November 1996); and K.-D. Suh et al, "A 3.3 V 32 Mb NAND Flash Memory with Incremental Step Pulse Programming Scheme," IEEE J. of Solid State Circuits, vol. 30, No. 11, 1149-1156, (November 1995), incorporated by reference herein. Generally, during a Program/Verify cycle, the flash memory 160 gradually applies an increasing voltage to store a charge in the cell transistor until a minimum target threshold voltage (also referred to herein as a "program voltage") is exceeded. For example, when programming a '10' data state in the example of FIG. 2, the flash memory 160 may gradually apply an increasing voltage to store a charge in the cell transistor until a minimum target threshold voltage of 0.4V is exceeded.

As discussed further below, each of the two bits stored in a single memory cell is from a different page. In other words, each bit of the two bits stored in each memory cell carries a different page address. The right side bit shown in FIG. 2 is accessed when a lower page address is input. The left side bit is accessed when an upper page address is input.

Figure 3:
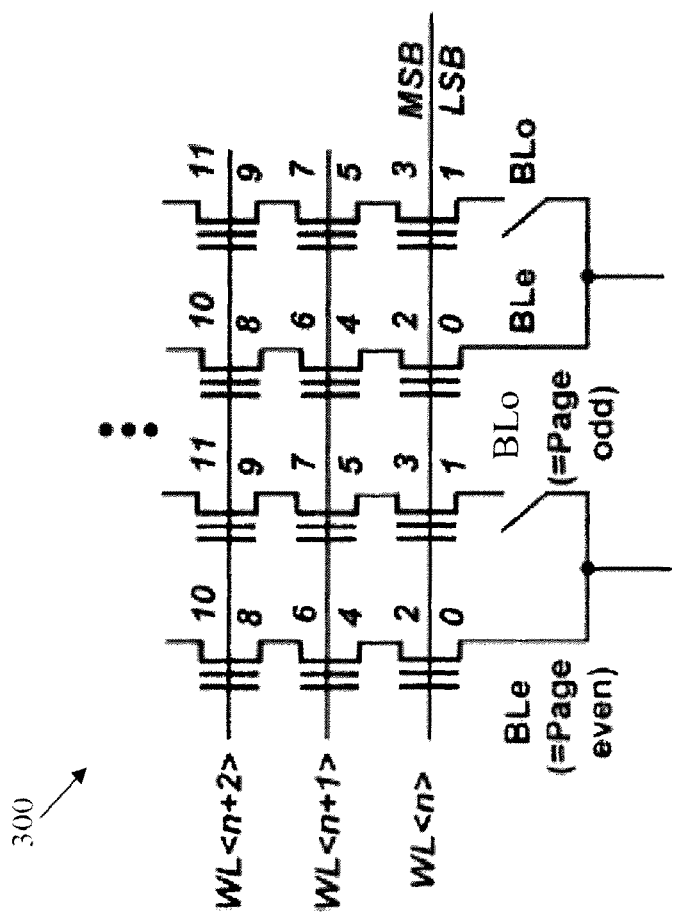
FIG. 3 illustrates the architecture of an exemplary flash cell array in a multi-level cell (MLC) flash memory device.

FIG. 3 illustrates the architecture of an exemplary flash cell array 300 in a multi-level cell (MLC) flash memory device 160, where each exemplary cell typically corresponds to a floating-gate transistor that stores two bits. In FIG. 3 each cell is associated with two numbers for the two pages to which the two bits belong. The exemplary cell array section 300 shows wordlines n through n+2 and four bitlines. The exemplary flash cell array 300 is partitioned into even and odd pages, where for example cells with even numbers (such as the cell with the numbers 0 and 2) correspond to even pages, and cells with odd numbers (such as the cell with the numbers 1 and 3) correspond to odd pages. Wordline n stores for example even pages 0 and 2 in the even bitlines, and odd pages 1 and 3 in the odd bit lines.

In addition, FIG. 3 indicates an exemplary program sequence where either an even or odd bitline cell is selected and programmed sequentially (bottom up) in the indicated order. The numbers indicate the order in which the pages are programmed. For example, page 0 is programmed before page 1. For a further discussion of the programming of even and odd pages, see for example K.-T. Park et al., "A Zeroing Cell-to-Cell Interference Page Architecture with Temporary LSB Storing and Parallel MSB Program Scheme for MLC NAND Flash Memories," IEEE Journal of Solid-State Circuits, Vol. 43, No. 4, 919-928 (April 2008), incorporated by reference herein.

Figure 4:
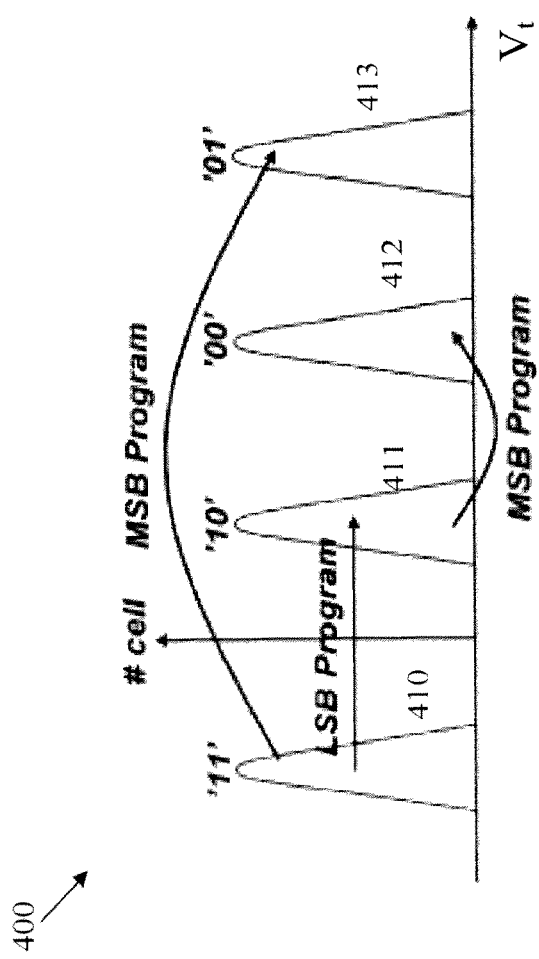
FIG. 4 illustrates an exemplary two-stage MLC programming scheme for the voltage assignment scheme of FIG. 2.

FIG. 4 illustrates an exemplary two-stage MLC programming scheme 400 for the voltage assignment scheme of FIG. 2. As shown in FIG. 4, during an LSB program stage, the states of selected cells that are in an erased state 410 move to the lowest programmed state 411 if the LSB is zero. Thus, at the LSB programming stage, a memory cell is programmed from the erased state '11' to '10'. Next, during the MSB program stage, two states, state '00' (412) and state '01' (413) are formed sequentially, depending on the previous LSB data. Generally, during the MSB programming stage, the '10' state is programmed to '00', and the state '11' is programmed to '01'.

It is noted that the programming scheme 400 of FIG. 4 illustrates a maximum voltage shift associated with the change in state from state 410 to state 413. A number of programming schemes have been proposed or suggested to reduce the maximum voltage shift associated with a change in state, and thereby reduce the ICI caused by voltage shifts.

FIGS. 5A and 5B, collectively, illustrate an alternative MLC programming scheme 500 that reduces the ICI inflicted on neighboring cells. As shown in FIG. 5A, during the LSB programming stage, a memory cell is programmed from a state '11' to a state 'x0' as a temporary (or intermediate) state, in a similar manner to SLC programming. After the neighbor cells in the same wordline are also LSB programmed, the distribution is possibly widened as shown by peak 510 in FIG. 5A, due to ICI. Thereafter, at the MSB programming stage, shown in FIG. 5B, the 'x0' state is programmed to either '00' and '10' as the final state corresponding to the input data or else the '11' state is programmed to the final '01' state. Generally, all memory cells except '11' cells are reprogrammed to their final states at the MSB programming stage from the temporary programmed state for LSB data so that the ICI caused by neighbor cells can be largely reduced. A cell in the final state will not suffer from ICI it experienced while being in the intermediate state since it has been reprogrammed to the final state. A cell in the final state will only suffer from ICI it experienced since being in the final state. As noted above, the multi-step programming sequence of FIGS. 5A and 5B, using intermediate program states, reduces the maximum voltage changes and therefore the ICI caused by these voltage changes. It can been seen in FIG. 5B that the maximum voltage shifts for example during the MSB programming stage are associated with transitions from state '11' to '01' and state 'x0' to state '10' respectively. These voltage shifts are significantly smaller than the maximum voltage shift from state '11' to '01' in FIG. 4.

Figure 6:
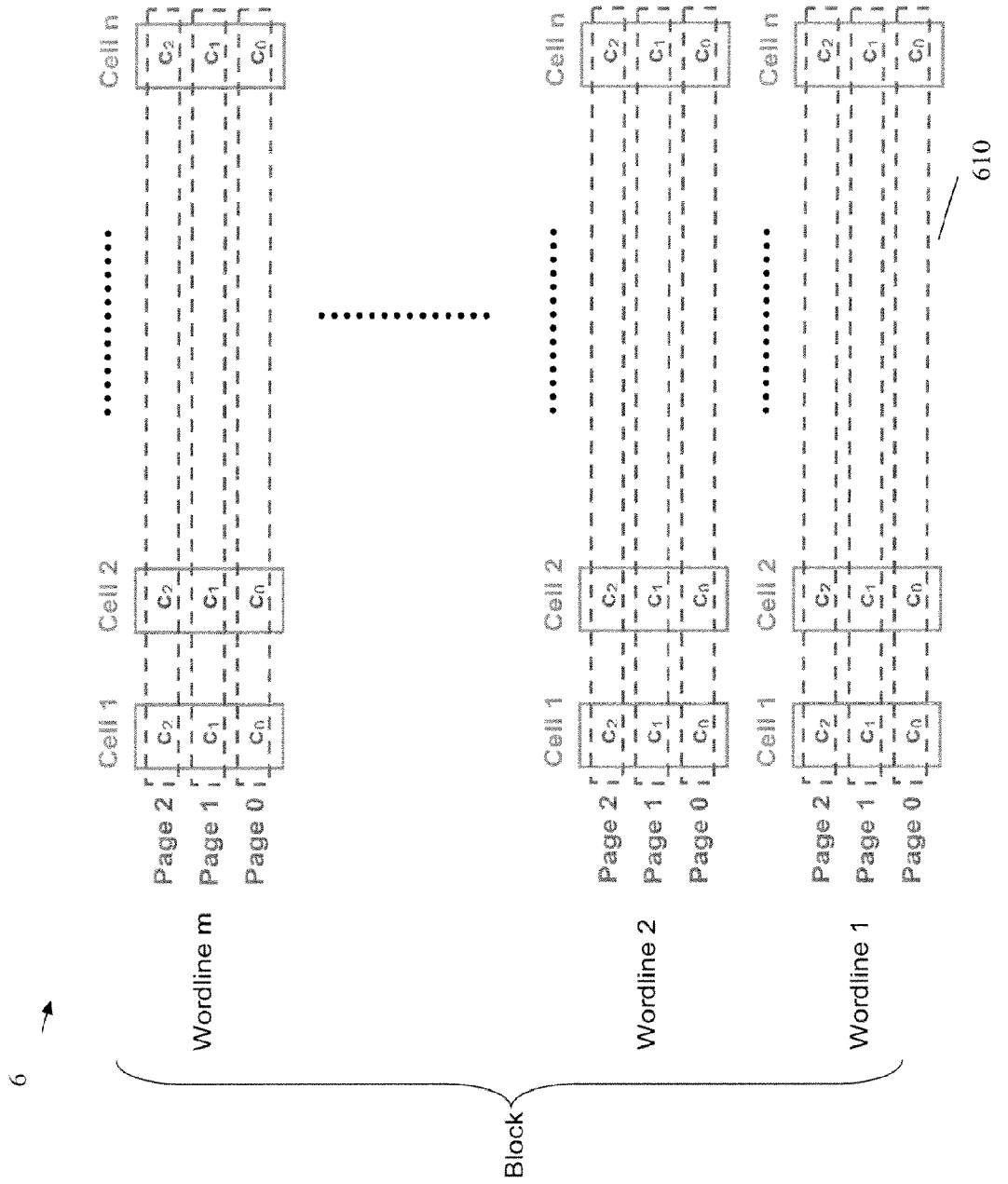
FIG. 6 illustrates an exemplary flash cell array in a multi-level cell (MLC) flash memory device in further detail.

FIG. 6 illustrates an exemplary flash cell array 600 in a multi-level cell (MLC) flash memory device 130 in further detail. As shown in FIG. 6, the flash cell array 600 stores three bits per flash cell, $c_i$. FIG. 6 illustrates the flash cell array architecture for one block, where each exemplary cell typically corresponds to a floating-gate transistor that stores three bits. The exemplary cell array 600 consists of in wordlines and n bitlines. Typically, in current multi-page cell flash memories the bits within a single cell belong to different pages. In the example of FIG. 6, the three bits for each cell correspond to three different pages, and each wordline stores three pages. In the following discussion, pages 0, 1, and 2 are referred to as the lower, middle, and upper page levels within a wordline.

As indicated above, a flash cell array can be further partitioned into even and odd pages, where for example cells with even numbers (such as cells 2 and 4 in FIG. 6) to correspond to even pages, and cells with odd numbers (such as cells 1 and 3 in FIG. 6) correspond to odd pages. In this case, a page (such as page 0) would contain an even page (even page 0) in even cells and an odd page (odd page 0) in odd cells.

Intercell Interference

Figure 7:
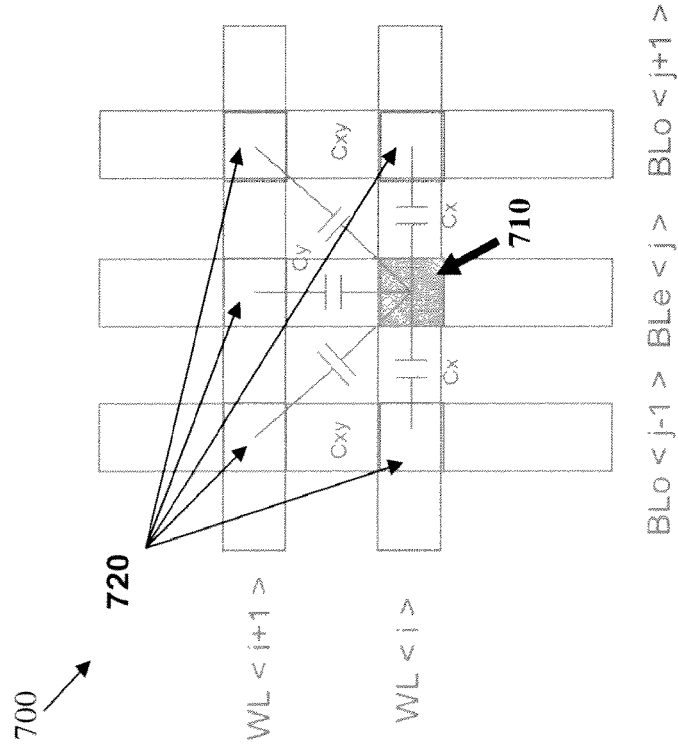
FIG. 7 illustrates the ICI that is present for a target cell due to the parasitic capacitance from a number of exemplary aggressor cells.

As previously indicated, ICI is a consequence of parasitic capacitances between cells and is generally considered to be one of the most prominent sources of distortion. FIG. 7 illustrates the ICI that is present for a target cell 710 due to the parasitic capacitance from a number of exemplary aggressor cells 720. The following notations are employed in FIG. 7:

WL: wordline;
BL: bitline;
BLo: odd bitline;
BLe: even bitline; and
C: capacitance.

ICI is caused by aggressor cells 720 that are programmed after the target cell 710 has been programmed. The ICI changes the voltage, $V_t$, of the target cell 710. In the exemplary embodiment, a "bottom up" programming scheme is assumed and adjacent aggressor cells in wordlines i and i+1 cause ICI for the target cell 710. With such bottom-up programming of a block, ICI from the lower wordline i−1 is removed, and up to five neighboring cells contribute to ICI as aggressor cells 720, as shown in FIG. 7. It is noted, however, that the techniques disclosed herein can be generalized to cases where aggressor cells from other wordlines, such as wordline i−1, contribute to ICI as well, as would be apparent to a person of ordinary skill in the art. If aggressor cells from wordlines i−1, i and i+1 contribute to ICI, up to eight closest neighboring cells need to be considered. Other cells that are further away from the target cell can be neglected, if their contribution to ICI is negligible. In general, the aggressor cells 720 are identified by analyzing the programming sequence scheme (such as bottom up or even/odd techniques) to identify the aggressor cells 720 that are programmed after a given target cell 710.

The ICI caused by the aggressor cells 720 on the target cell 710 can be modeled in the exemplary embodiment as follows:

$$\Delta V_{ICI}^{(i,j)} = k_x \Delta V_t^{(i,j-1)} + k_x \Delta V_t^{(i,j+1)} + k_y \Delta V_t^{(i+1,j)} + k_{xy} \Delta V_t^{(i+1,j-1)} + k_{xy} \Delta V_t^{(i+1,j+1)} \quad (1)$$

where $\Delta V_t^{(w,b)}$ is the change in $V_t$ voltage of agressor cell (w,b), $\Delta V_{ICI}^{(i,j)}$ is the change in $V_t$ voltage of target cell (i,j) due to ICI and $k_x$, $k_y$ and $k_{xy}$ are capacitive coupling coefficients for the x, y and xy direction.

Generally, $V_t$ is the voltage representing the data stored on a cell and obtained during a read operation. $V_t$ can be obtained by a read operation, for example, as a soft voltage value with more precision than the number of bits stored per cell, or as a value quantized to a hard voltage level with the same resolution as the number of bits stored per cell (e.g., 3 bits for 3 bits/cell flash).

System Level Considerations

Figure 8:
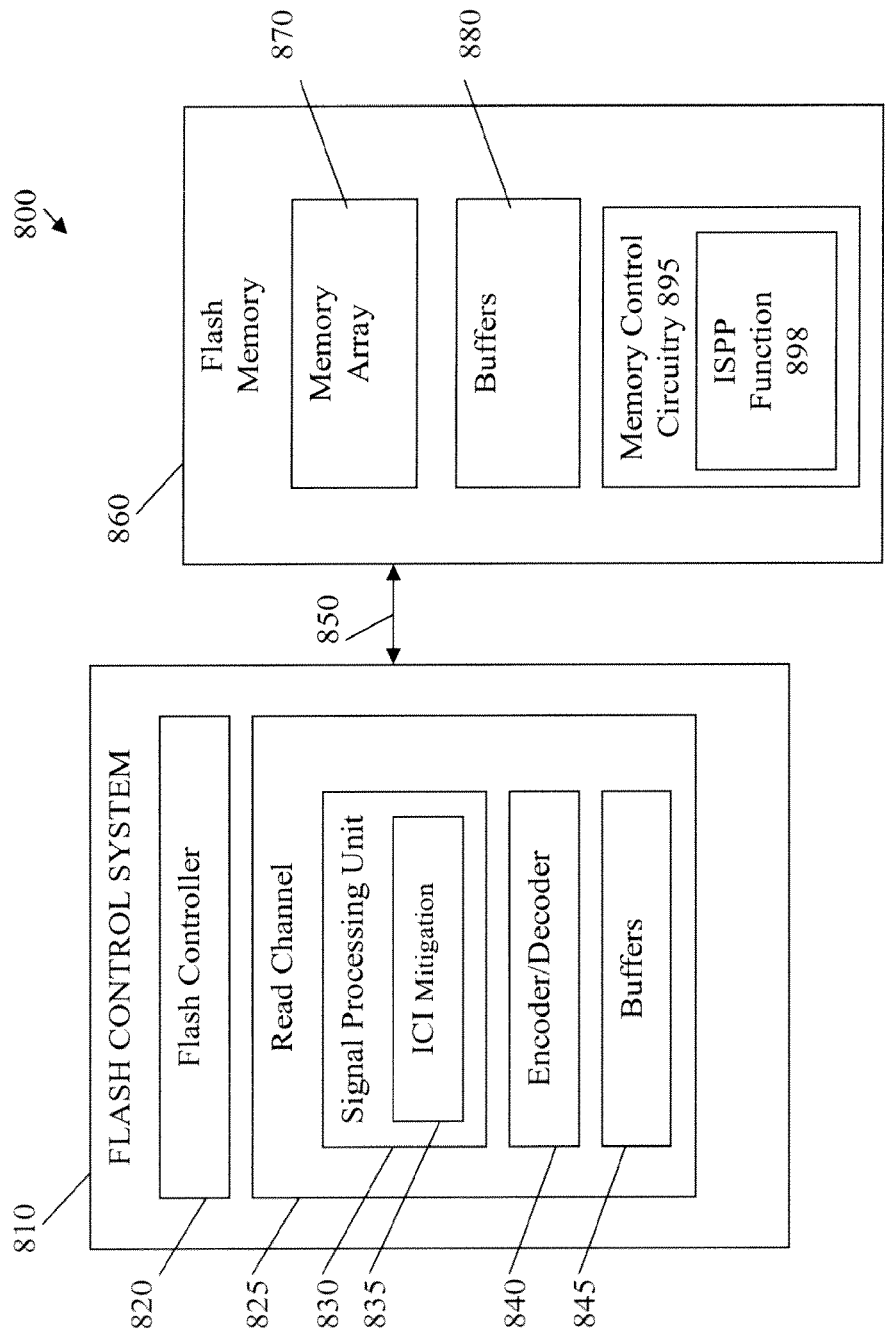
FIG. 8 is a schematic block diagram of an exemplary flash memory system incorporating controller-based ICI mitigation techniques.

FIG. 8 is a schematic block diagram of an exemplary flash memory system 800 incorporating controller-based ICI mitigation techniques. As shown in FIG. 8, the exemplary flash memory system 800 comprises a flash control system 810 and a flash memory block 860, connected by an interface 850. The exemplary flash control system 810 comprises a flash controller 820 and a read channel 825, typically on one or more integrated circuits. The exemplary flash controller 820 may be implemented, for example, using well-known commercially available techniques and/or products, as modified herein to support the features and functions of the present invention.

The exemplary read channel 825 comprises a signal processing unit 830, an encoder/decoder block 840 and one or more buffers 845. It is noted that the term "read channel" can encompass the write channel as well. In an alternative embodiment, the encoder/decoder block 840 and some buffers 845 may be implemented inside the flash controller 820. The encoder/decoder block 840 and buffers 845 may be implemented, for example, using well-known commercially available techniques and/or products, as modified herein to provide the features and functions of the present invention.

The exemplary signal processing unit 830 comprises one or more processors that implement one or more ICI mitigation processes 835, discussed further below in conjunction with, for example, FIG. 10. In addition, the data flow among the various blocks shown in FIG. 8 is also discussed further below in conjunction with, for example, FIG. 10. Generally, as discussed further below in conjunction with FIG. 10, to perform ICI mitigation during a write operation, the one or more ICI mitigation processes 835 generate precompensated program values to be stored in the memory array 870 based on program data for the target and aggressor cells.

The exemplary flash memory block 860 comprises a memory array 870, one or more buffers 880 and memory control circuitry 895. The buffers 880 may each be implemented using well-known commercially available techniques and/or products. The exemplary memory control circuitry 895 further comprises one or more ISPP (Incremental Step Pulse Programming) functions 898 that write the computed precompensated program values to the memory array 870, as discussed further below in conjunction with FIGS. 11-13. In addition, the memory control circuitry 895 may also comprise read functionality (e.g., sense amplifiers), even/odd bitline selection functionality and cache/buffer storage for programming, as would be apparent to a person of ordinary skill in the art. For a discussion of conventional Incremental Step Pulse Programming techniques, see, for example, United States Patent Application Publication No. 2008/0084751; Ki-Tae Park, et al., "A Zeroing Cell-to-Cell Interference Page Architecture With Temporary LSB Storing and Parallel MSB Program Scheme for MLC NAND Flash Memories," IEEE J. of Solid State Circuits, Vol. 43, No. 4, 919-928, (April 2008); T.-S. Jung, "A 117-mm² 3.3-V only 128-Mb Multilevel NAND Flash Memory for Mass Storage Applications," IEEE J. of Solid State Circuits, vol. 31, No. 11, 1575-1583, (November 1996); and K.-D. Suh et al. "A 3.3 V 32 Mb NAND Flash Memory with Incremental Step Pulse Programming Scheme," IEEE J. of Solid State Circuits, vol. 30, No. 11, 1149-1156, (November 1995), incorporated by reference herein. While the invention is illustrated primarily in the context of ICI mitigation, the present invention can be applied to the mitigation of any disturbance, as would be apparent to a person of ordinary skill in the art.

In various embodiments of the disclosed ICI mitigation techniques, the exemplary interface 850 may need to convey additional information relative to a conventional flash memory system, such as values representing information associated with aggressor cells. Thus, the interface 850 may need to have a higher capacity (for example more input or output pins) or faster rate than an interface in conventional flash memory systems. The interface 850 may optionally be implemented, for example, in accordance with the teachings of International PCT Patent Application Serial No. PCT/US09/49328, entitled "Methods and Apparatus for Interfacing Between a Flash Memory Controller and a Flash Memory Array," filed Jun. 30, 2009 and incorporated by reference herein, which increases the information-carrying capacity of the interface 850 using, for example, Double Data Rate (DDR) techniques.

During a write operation, the interface 850 transfers the precompensated program values to be stored in the target cells, typically using page or wordline level access techniques. For a more detailed discussion of exemplary page or wordline level access techniques, see, for example, International Patent Application Serial No. PCT/US09/36810, filed Mar. 11, 2009, entitled "Methods and Apparatus for Storing Data in a Multi-Level Cell Flash Memory Device with Cross-Page Sectors, Multi-Page Coding And Per-Page Coding,", incorporated by reference herein. Typically, more bits are required to represent precompensated program values than to represent original program values since the number of precompensated program values is typically larger than the number of original program values. Therefore, for write-side ICI mitigation, the interface 850 needs to transfer more data than a conventional interface.

In the embodiment of FIG. 8, the disclosed write-side ICI mitigation techniques are implemented outside the flash memory, typically in a process technology optimized for logic circuits to achieve the lowest area. It is at the expense, however, of the additional aggressor cell data that must be transferred on the interface 850.

Figure 9:
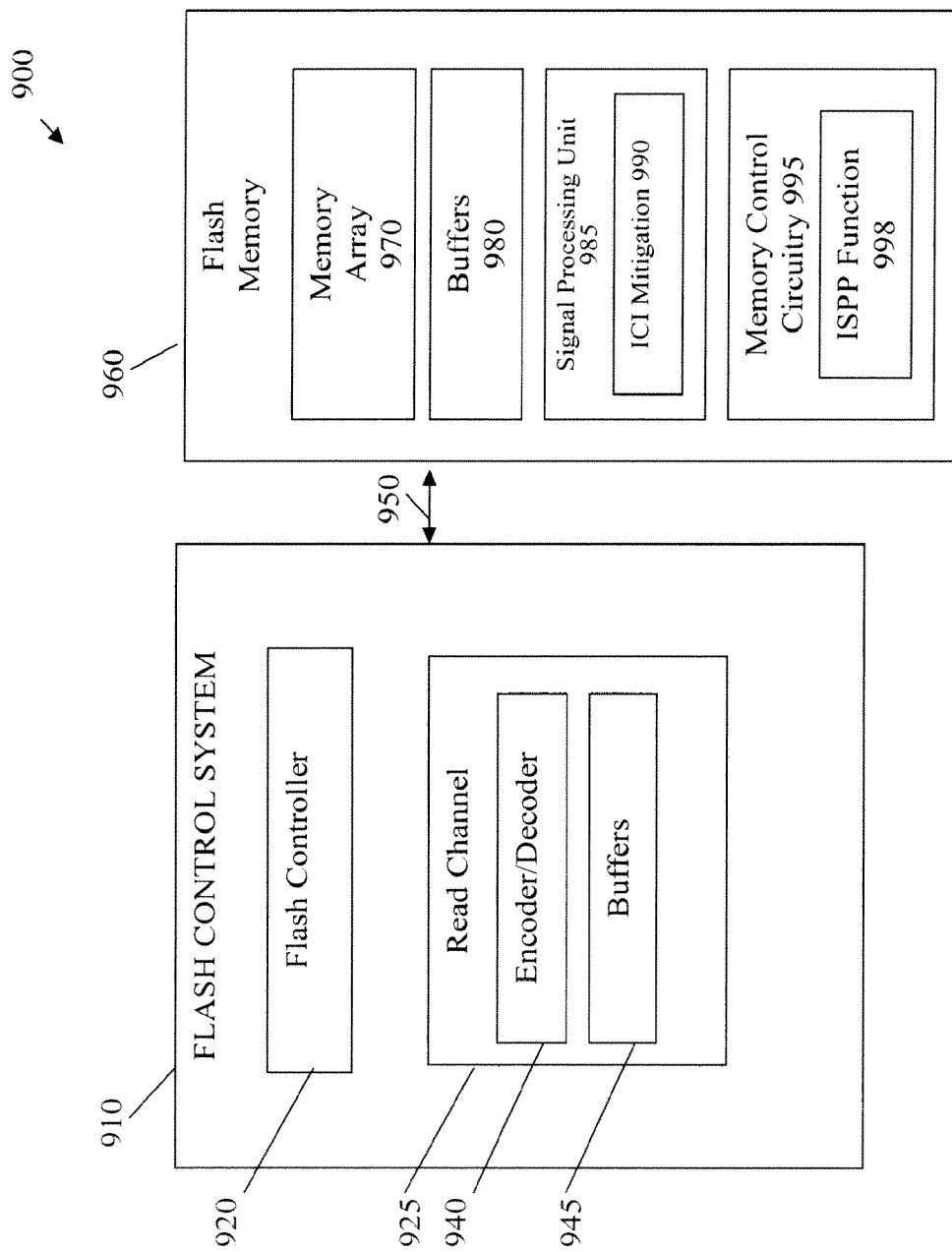
FIG. 9 is a schematic block diagram of an exemplary flash memory system incorporating memory-based ICI mitigation techniques.

FIG. 9 is a schematic block diagram of an exemplary flash memory system 900 incorporating memory-based ICI mitigation techniques in accordance with an alternate embodiment. As shown in FIG. 9, the exemplary flash memory system 900 comprises a flash control system 910 and a flash memory block 960, connected by an interface 950. The exemplary flash control system 910 comprises a flash controller 920 and an optional read channel 925, typically on one or more integrated circuits. The exemplary read channel 925 comprises an encoder/decoder block 940 and one or more buffers 945. In an alternative embodiment, the encoder/decoder block 940 and some buffers 945 may be implemented inside the flash controller 920. The exemplary flash controller 920 may be implemented, for example, using well-known commercially available techniques and/or products, as modified herein to support the features and functions of the present invention. The encoder/decoder block 940 and buffers 945 may be implemented using well-known commercially available techniques and/or products.

The exemplary flash memory block 960 comprises a memory array 970, one or more buffers 980, a signal processing unit 985 and memory control circuitry 995. The buffers 980 may each be implemented using well-known commercially available techniques and/or products. The exemplary signal processing unit 985 comprises one or more processors that implement one or more ICI mitigation processes 990, discussed further below in conjunction with, for example, FIG. 10.

In addition, the data flow among the various blocks shown in FIG. 9 is also discussed further below in conjunction with, for example, FIG. 10. Generally, as discussed further below in conjunction with FIG. 10, to perform ICI mitigation during a write operation, the one or more ICI mitigation processes 990 generate precompensated program values based on the program data received from the flash controller 910 for the target and aggressor cells.

The exemplary memory control circuitry 995 further comprises one or more ISPP functions 998 that write the computed precompensated program values to the flash memory array 970, in a similar manner to FIG. 8 and as discussed further below in conjunction with FIGS. 11-13. In addition, the memory control circuitry 995 may also comprise read functionality (e.g., sense amplifiers), even/odd bitline selection functionality and cache/buffer storage for programming, as would be apparent to a person of ordinary skill in the art.

In various embodiments of the disclosed ICI mitigation techniques, the exemplary interface 950 may need to convey additional information relative to a conventional flash memory system, such as values representing information associated with aggressor cells. Thus, the interface 950 may need to have a higher capacity (for example more input or output pins) or faster rate than an interface in conventional flash memory systems. The interface 950 may optionally be implemented, for example, in accordance with the teachings of International PCT Patent Application Serial No. PCT/US09/49328, entitled "Methods and Apparatus for Interfacing Between a Flash Memory Controller and a Flash Memory Array," filed Jun. 30, 2009 and incorporated by reference herein, which increases the information-carrying capacity of the interface 950 using, for example, Double Data Rate (DDR) techniques.

During a write operation, the interface 950 transfers the program data to be stored in the target and aggressor cells, and the precompensated program values are computed inside the flash memory 960. The interface 950 would transfer for example the program data for the page with the target cell as in a conventional flash memory system, and in addition program data for adjacent wordlines or even or odd bit lines with the aggressor cells. Typically, less bits are required to represent this program data than to represent precompensated program values. Therefore, for write-side ICI mitigation, interface 950 would typically require less bandwidth than interface 850. This is however at the expense of implementing the write-side ICI mitigation processes inside the memory using the memory process technology used to manufacture the flash memory, which is typically optimized for memory and not logic circuits.

It is noted that the capacitive coupling coefficients, $k_x$, $k_y$ and $k_{xy}$, employed in the various embodiments of the ICI mitigation techniques of FIGS. 8 and 9 can be computed in the flash control system 810, 910 and/or the flash memory block 860, 960. It may be necessary for the capacitive coupling coefficients, $k_x$, $k_y$ and $k_{xy}$, to be transferred on the respective interface 850, 950. It is noted that the capacitive coupling coefficients may be adaptive and updated on a continuous, occasional or periodic basis.

As previously indicated, various aspects of the present invention provide signal processing techniques to mitigate ICI. Among other benefits, signal processing approaches to ICI mitigation are not bounded by technology and physical restrictions. Generally, as discussed hereinafter, write-side ICI mitigation can be achieved during programming of the target cells 710 with the knowledge of the program voltages that will be stored in the aggressor cells 720.

Write-Side ICI Mitigation

Figure 10:
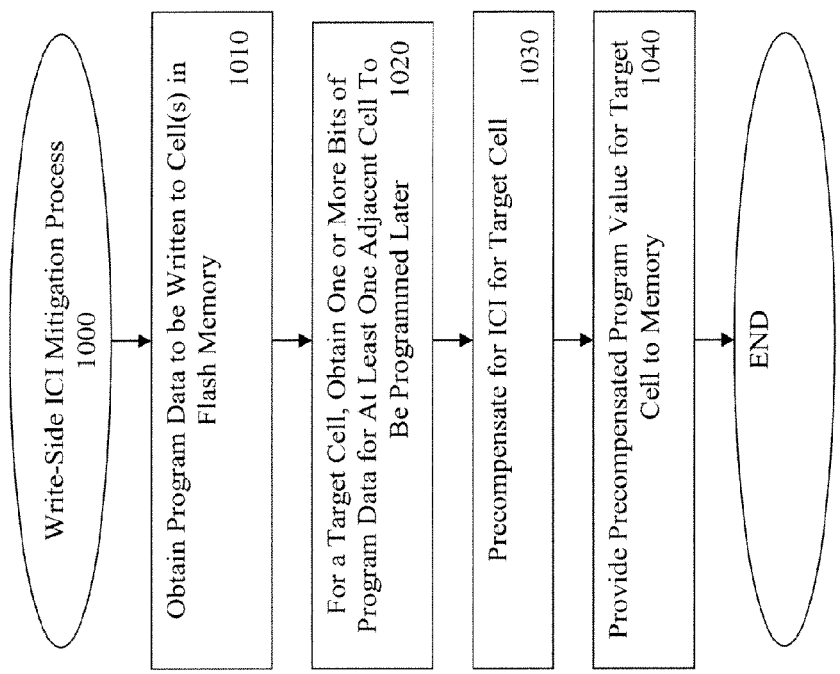
FIG. 10 is a flow chart describing an exemplary implementation of a write-side ICI mitigation process incorporating features of the present invention.

FIG. 10 is a flow chart describing an exemplary implementation of a write-side ICI mitigation process 1000 incorporating features of the present invention. As discussed above in conjunction with FIGS. 8 and 9, the write-side ICI mitigation process 1000 would typically be implemented by the signal processing unit 830 in the flash control system 810 or the signal processing unit 985 in the flash memory 960. As shown in FIG. 10, the write-side ICI mitigation process 1000 initially obtains program data to be written to one or more target cells 710 in the flash memory 700 during step 1010. As previously indicated, a more detailed discussion of exemplary page or wordline level access techniques can be found, for example, in International Patent Application Serial No.

PCT/US09/36810, filed Mar. 11, 2009, entitled "Methods and Apparatus for Storing Data in a Multi-Level Cell Flash Memory Device with Cross-Page Sectors, Multi-Page Coding and Per-Page Coding," incorporated by reference herein.

Thereafter, during step 1020, for a target cell 710, the write-side ICI mitigation process 1000 obtains one or more bits of program data for at least one adjacent cell 720 to be programmed later. It is noted that the aggressor cells 720 obtained during step 1020 may be associated with adjacent pages in a memory 700 and the write-side ICI mitigation process 1000 may have to wait until the program data for the aggressor cells 720 become available. The program data for the target cell and potential aggressor cells may be stored for example in the buffers 845 or 980 until all values for the aggressor cells become available. These buffers may store for example the page with the target cell, and adjacent pages in x, y or xy direction in adjacent wordlines or adjacent even or odd bitlines until a sufficient amount of data has been collected to perform ICI mitigation. Program data for potential aggressor cells may be available in the buffers from a prior write process. As previously indicated, the aggressor cells 720 are identified by analyzing the programming sequence scheme (such as bottom up or even/odd techniques) to identify the aggressor cells 720 that are programmed after a given target cell 710.

The write-side ICI mitigation process 1000 precompensates for ICI for the target cell during step 1030. The new program voltage of the target cell 710 that compensates for the expected ICI is obtained with following equation:

$$PV_{tc}^{(i,j)} = PV_t^{(i,j)} - \Delta V_c^{(i,j)} \qquad (2)$$

where $PV_t$ is the original program voltage or target threshold voltage; $PV_{tc}$ is the new program voltage or target threshold voltage after ICI cancellation and $\Delta V_c$ is the ICI cancellation term.

Generally, the ICI mitigation term for equation (2) is computed based on the coupling coefficients and the voltage changes of the aggressor cells 720. As previously indicated, in the exemplary embodiment of FIG. 7, the aggressor cells 720 comprise the cells in the same wordline and the upper adjacent wordline. Optionally, also aggressor cells in the lower adjacent wordline can be considered if they cause ICI. Thus, both the shift and widening of the voltage distributions clue to ICI are mitigated.

The ICI mitigation term can be computed as follows:

$$\Delta V_c^{(i,j)} = k_x \Delta V_t^{(i,j-1)}(l) + k_x \Delta V_t^{(i,j+1)}(l) + k_y \Delta V_t^{(i+1,j)}(l) + k_{xy} \Delta V_t^{(i+1,j-1)}(l) + k_{xy} \Delta V_t^{(i+1,j+1)}(l) \qquad (3)$$

where $\Delta V_t^{(w,b)}(l)$ is the change in the $V_t$ voltage of cell (w,b) when voltage level l is programmed into cell (w,b); $l \in \{1, 2, \ldots L\}$ is the voltage level (L=8 for 3 bits/cell); and $k_x$, $k_y$, and $k_{xy}$ are the capacitive coupling coefficients. Note that different voltage levels l can be programmed into the different target and agressor cells.

For $\Delta V_t^{(w,b)}(l)$, the expected or average change in the $V_t$ voltage can be used, for example. Finally, the precompensated program values computed for the target cell 710 during step 1030 are provided to the flash memory 860, 960 during step 1040.

ICI Mitigation Simplifications

A. Multi-Step Page Programming Sequence

As discussed above, FIGS. 5A and 5B illustrate an exemplary multi-step page programming sequence. An aspect of the present invention recognizes that when a multi-step page programming sequence is applied to an MLC flash device 600, the ICI that appears during the intermediate programming is offset by subsequent programming of the final upper page. Generally, the final programming of the upper (MSB) page reprograms and tightens the distribution of the final programmed voltages and therefore cancels ICI, which was applied to the intermediate state. Thus, in one embodiment of the invention, ICI is only canceled when the final upper most page (MSB) is programmed. It is optional to cancel ICI for the programming of lower pages (i.e., intermediate states), but in general not required to achieve good error rate performance. For example, for the three bits/cell flash device 600 of FIG. 6, the intermediate programming of the lower and middle pages can be ignored.

Generally, for write-side ICI mitigation, knowledge of the program levels l of aggressor cells, for example in adjacent wordlines or bitlines is required. In general, there are L different $\Delta V_t(l)$ values in equation (3). In the exemplary MLC flash cell array 600 of FIG. 6, for example, L is equal to 8 in the MLC flash cell array 600 having three bits per cell. One aspect of the present invention, however, recognizes that depending on the employed programming algorithm, only M different $\Delta V_t(l)$ can be used to approximately describe the L different $\Delta V_t(l)$ values, where M<L. For the exemplary programming scheme shown in FIG. 5B, it is sufficient to consider M=3 different $\Delta V_t(l)$ since the transitions from '11' to '01' and 'x0' to '10' have approximately the same voltage shift. The more complex ICI mitigation process would consider L=4 different $\Delta V_t(l)$ values for all possible transitions '11' to '11', '11' to '01', 'x0' to '00', 'x0' to '10'. In the embodiment of FIG. 7 the number of distinct $\Delta V_c$ values in equations (2) and (3) is then $M^5$ instead of $L^5$, as there are five adjacent cells 720 that cause ICI. The number of distinct $\Delta V_c$ values that need to be computed is therefore significantly reduced when M<L.

When a multi-step page programming sequence is employed for the exemplary flash memory shown in FIG. 7, the controller-based or memory-based ICI mitigation processes 1000 of FIG. 10 are implemented as follows. The page data is temporarily stored in the butler memory 845 or 980 and not written to the flash memory device 870, 970 until the upper page data for the upper adjacent wordline is available. The respective ICI mitigation block 835 or 990 computes the new program voltages (precompensated program values) based on these data bits, as discussed above in conjunction with FIG. 10. If the power supply voltage drops below a threshold voltage, for example, due to a power interruption or shutdown, the data stored in the buffer memory 845 or 980 can be written to the flash memory 870, 970 (or another non-volatile memory) to prevent loss of data.

The above-described write-side side ICI mitigation can be applied not only to the final state, but also intermediate states, for example when a middle page in a 3-bits/cell flash is programmed. It is noted that multi-step page programming considerations affect both the reading and writing of a flash memory. Once programmed to an intermediate state, a cell can be maintained in the intermediate state indefinitely.

B. Neglect Capacitive Coupling Coefficients in X-Y Direction

As previously indicated, in the exemplary embodiment, equation (3) considers capacitive coupling coefficients, $k_x$, $k_y$, and $k_{xy}$, to address ICI between a target cell 710 and up to five adjacent aggressor cells 720 in the exemplary flash memory shown in FIG. 7. Another aspect of the invention recognizes, however, that $k_{xy} \ll k_x < k_y$. Thus, capacitive coupling in the x-y direction, $k_{xy}$, can be neglected in equation (3), and the ICI mitigation term becomes:

$$\Delta V_c^{(i,j)} = k_x \Delta V_t^{(i,j-1)}(l) + k_x \Delta V_t^{(i,j+1)}(l) + k_y \Delta V_t^{(i+1,j)}(l) \qquad (4).$$

The number of distinct $\Delta V_c$ values is then reduced to $L^3$ instead of $L^5$ as given by equation (3). The number of distinct $\Delta V_c$ values can be further reduced by considering only M<L distinct voltage shifts $\Delta V_t(l)$. The number of distinct $\Delta V_c$ values that need to be computed is then reduced to $M^3$. In general, in ICI mitigation simplifications A and B, the number of distinct $\Delta V_c$ values is given by $M^k$ where k is the number of considered aggressor cells and M is the number of distinct voltage shifts that are considered. Equation (3) for write-side mitigation can be simplified as described here. By reducing the number of distinct $\Delta V_c$ values, also the number of precompensated program values is reduced as is apparent from equation (2). This helps for example to reduce the amount of data that needs to be transmitted over the interface 850 and as results, the capacity of the interface 850 (in terms of pins or transmission rate) can be reduced compared to a write-side mitigation scheme that does not reduce the number of distinct $\Delta V_c$ values by considering only M<L distinct voltage shifts $\Delta V_t(l)$.

C. Neglect Coefficient in X Direction For Even/Odd Programming

As discussed above in conjunction with FIG. 3, an exemplary even/odd programming sequence selects either an even or odd bitline cell and programs sequentially (bottom up) in the indicated order. Another aspect of the present invention recognizes that coupling in the x direction can be neglected for either even or odd pages (for example, for odd pages if odd pages are programmed after even pages). Therefore, for odd pages, the ICI mitigation term in equation (3) simplifies to:

$$\Delta V_c^{(i,j)} = k_y \Delta V_t^{(i+1,j)}(l). \qquad (5)$$

where the number of distinct $\Delta V_c$ values that need to be computed is reduced to only M. Some flash architectures with parallel programming of odd and even bit lines allow for x coupling to be omitted all together with little performance loss. In general, Equation (5) can be used for both even and odd pages to reduce hardware complexity. Equation (3) for write-side mitigation can be simplified as described here.

Improved ISPP Techniques

According to one aspect of the present invention, improved ISPP techniques are provided for programming a plurality of threshold voltages for one voltage level or data state. In one exemplary embodiment discussed below in conjunction with FIG. 12, the disclosed ISPP process 1200 programs each voltage level of a flash memory device using a programming phase and a plurality of verify phases. In another exemplary embodiment discussed below in conjunction with FIG. 13, the disclosed ISPP process 1300 programs all voltage levels of a flash memory device using a programming phase and a plurality of verify phases, where at least one of the voltage levels comprises a plurality of program voltages or target threshold voltages that are being programmed.

Among other applications, the disclosed ISPP techniques can be employed to program the computed precompensated program values for cell disturbance, such as the exemplary write-side ICI mitigation processes. As discussed above in conjunction with Equation (2), $PV_{tc}$ is the new program voltage or target threshold voltage after ICI mitigation. Thus, the program voltages among cells in the same wordline that store the same data or voltage level are different, as these program voltages depend on the stored data in neighboring cells.

The signal levels (also referred to as data states above in conjunction with FIG. 2) described herein could be represented using any number of exemplary signals, such as voltage levels, current levels or resistance levels. In one exemplary implementation, each storage element employs four possible data states to store two bits of data in each memory cell. Each possible data state has at least one corresponding program value, such as a corresponding program voltage (also referred to as a target threshold voltage), program current or program resistance. When the disclosed ISPP techniques are employed to program the computed precompensated program values for cell disturbance, for example, a given data state or signal level can have a plurality of corresponding program values.

Figure 11:
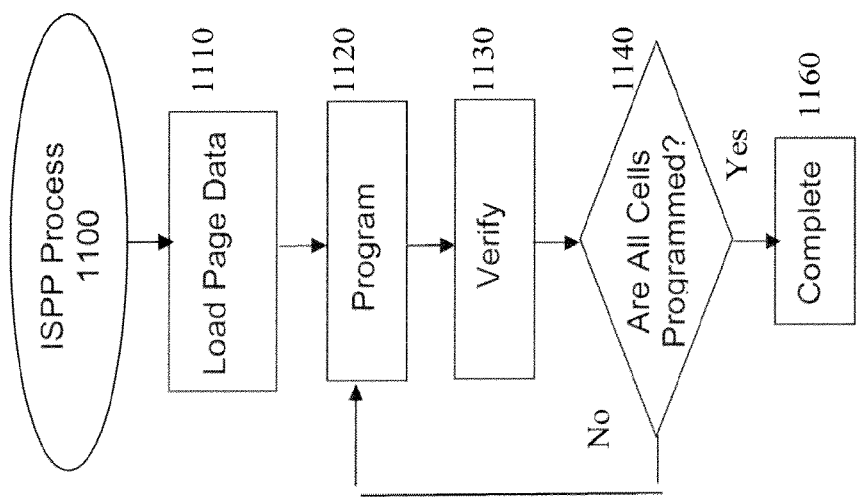
FIG. 11 is a flow chart describing a conventional ISPP (Incremental Step Pulse Programming) process.

FIG. 11 is a flow chart describing a conventional ISPP process 1100. For a discussion of conventional Incremental Step Pulse Programming techniques, see, for example, United States Patent Application Publication No. 2008/0084751; Ki-Tae Park, et al., "A Zeroing Cell-to-Cell Interference Page Architecture With Temporary LSB Storing and Parallel MSB Program Scheme for MLC NAND Flash Memories," IEEE J. of Solid State Circuits, Vol. 43, No. 4, 919-928, (April 2008); T.-S. Jung, "A 117-mm$^2$ 3.3-V only 128-Mb Multilevel NAND Flash Memory for Mass Storage Applications," IEEE J. of Solid State Circuits, vol. 31, No. 11, 1575-1583, (November 1996); and K.-D. Suh et al, "A 3.3 V 32 Mb NAND Flash Memory with Incremental Step Pulse Programming Scheme," IEEE J. of Solid State Circuits, vol. 30, No. 11, 1149-1156, (November 1995), incorporated by reference herein. Generally, the conventional ISPP process 1100 programs the same program voltage to all cells storing the same data or voltage level in an entire wordline, and there is only one target threshold voltage to be achieved in the entire wordline for one voltage level (also referred to as a data state, for example, in conjunction with FIG. 2). For example, for a multi-level cell that stores two bits per cell, there are four voltage levels or states.

As shown in FIG. 11, the conventional ISPP process 1100 initially loads the page data during step 1110. In a conventional programming process, only the page with the target cells (i.e., the page that will be programmed) is loaded. Typically, a flash memory will progressively program cells in order of increasing voltage levels. Initially, all cells programmed at the current voltage level, or a higher voltage level, are selected. The selected cells are programmed during step 1120 by applying a programming pulse. Thereafter, a verify phase is performed during step 1130 to determine if the selected cells have reached the desired target threshold voltage. Any verified cells, which have reached or surpassed the target threshold voltage, are deselected during step 1130. Generally, a verify phase reads one or more read values from the flash memory device and compares the read values to a threshold for the desired program voltage or target threshold voltage.

A test is performed during step 1140 to determine if all the cells have been programmed. If it is determined during step 1140 that all the cells have not been programmed, then program control returns to step 1120 to increment the programming pulse to further program the remaining cells to their target threshold voltages. If, however, it is determined during step 1140 that all the cells have been programmed, then program control terminates in step 1160.

The present invention recognizes that the program voltage adjustment for the exemplary ICI mitigation techniques can be different for cells in a page or wordline storing the same data due to the different intercell interference effects that depend on the data stored in adjacent cells. As discussed above, for the exemplary write-side ICI mitigation, knowledge of the program levels l of aggressor cells, for example, in adjacent wordlines or bitlines, is generally required. In general, there are L different $\Delta V_t(l)$ values in equation (3) for each of k aggressor cells 720. Thus, there are $N=L^k$ possible precompensated program values for each voltage level.

In the exemplary MLC flash cell array 600 of FIG. 6, for example, L is equal to 8 in the MLC flash cell array 600 having three bits per cell. One embodiment of the present invention, however, recognizes that depending on the employed programming algorithm, only M different $\Delta V_t(l)$ can be used to approximately describe the L different $\Delta V_t(l)$ values, where M>L. Then, only $N=M^k$ precompensated program values need to be computed for a voltage level and only $N=M^k$ verify phases need to be applied. Therefore, the number of verify phases has been reduced. Reducing the number of verify phases has the benefit of reducing programming time, which increases write speed. In an exemplary implementation, it is assumed that only the upper adjacent cell 720 causes the major ICI coupling on the target cell 710. Thus, the number of possible program voltages for one voltage level is limited to M levels (this can be regarded as a reduced-complexity version of the above-described disclosed ICI mitigation techniques) and only M verify phases need be applied. Therefore programming time is reduced even further. If a given flash memory has two signal levels and there is one aggressor cell 720, then M is equal to two. Likewise, if a given flash memory employs a multi-step page programming sequence, discussed further below, there is one aggressor cell 720 and write-side ICI cancellation is applied during the programming of the MSB page, then M is also equal to two for one voltage level. It is noted that the number, N, of precompensated program voltages for a voltage level does not need to be same for all voltage levels and each voltage level can have a distinct number N.

One aspect of the present invention provides an improved ISPP process 1200, discussed below in conjunction with FIG. 12, that programs a plurality of different program voltages for each voltage level. Generally, when a flash memory device has a plurality of program voltages, each of the program voltages can be associated with one of a plurality of disjoint groups. During programming of the flash memory device, each programming phase includes a plurality of verify phases. The number of the verify phases for a given disjoint group equals the number of members that are in the given disjoint group. For example, each disjoint group can correspond to a different voltage level (e.g., voltage threshold). Each disjoint group has a number of members which can be different from other disjoint groups. As previously indicated, the present invention can be employed with any storage mechanism for flash memories, such as the use of voltages, currents or resistances to represent stored data, as would be apparent to a person of ordinary skill in the art.

Figure 12:
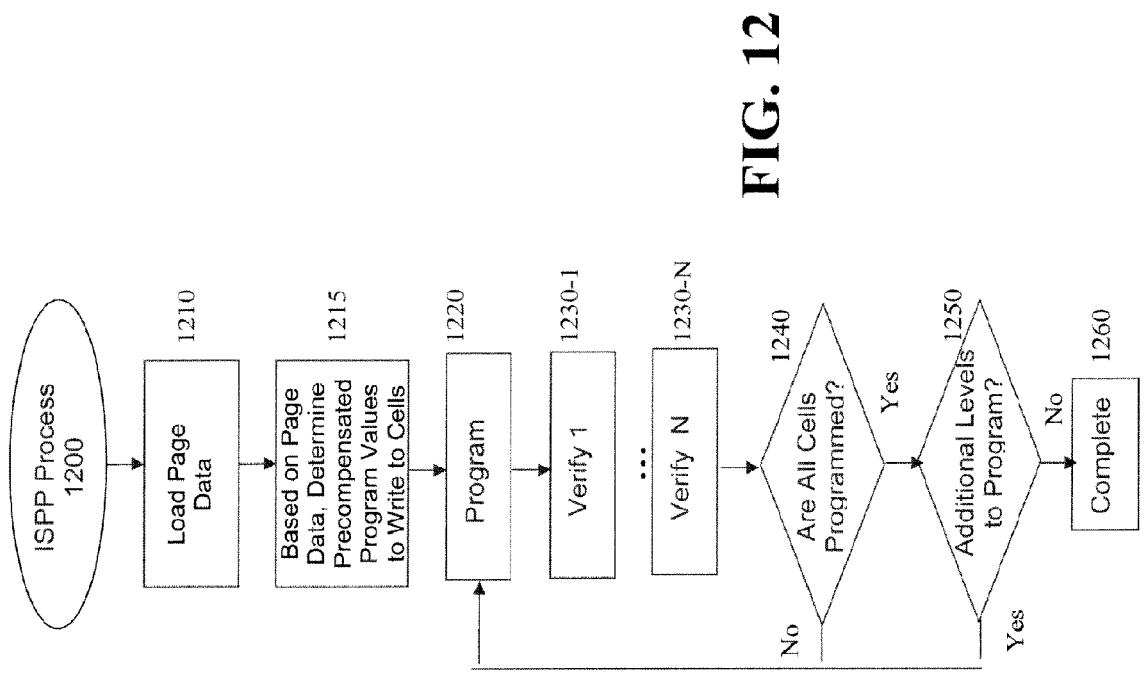
FIG. 12 is a flow chart describing an ISPP process incorporating features of the present invention.

FIG. 12 is a flow chart describing an ISPP process 1200 incorporating features of the present invention. Generally, the disclosed ISPP process 1200 programs a plurality of voltage levels to a wordline in a plurality of programming steps, wherein a programming step for at least one voltage level comprises a programming phase and a plurality of verify phases. Therefore, in at least one of the programming steps, the programmed voltage level is verified with a corresponding plurality of verify phases. In this manner, the program voltage adjustment for the exemplary ICI mitigation techniques can be different for cells in a page storing the same data.

As shown in FIG. 12, the disclosed ISPP process 1200 initially loads the page data during step 1210, which includes data for the target and aggressor cells as described above and in International Patent Application Serial No. PCT/US09/49327, entitled "Methods and Apparatus for Write-Side Intercell Interference Mitigation in Flash Memories," incorporated by reference herein. For example, this page data contains the current page to be programmed and additional pages, such as adjacent pages that contain aggressor cells. Based on the bits in the loaded page data, the precompensated program values are determined during step 1215 that are to be written to the cells in the flash memory device. The precompensated program values are computed in accordance with Equations (2) and (3), for example. As indicated above, a flash memory will typically progressively program cells in order of increasing voltage levels. Initially, all cells programmed at the current voltage level, or a higher level, are selected. The selected cells are programmed with the precompensated program values during step 1220. Thereafter, a plurality, N, of verify phases are performed during steps 1230-1 through 1230-N (collectively referred to as "steps 1230") to determine if the selected cells have reached the desired program or target threshold voltages. The number N of verify phases is equal to the number of distinct possible precompensated program values for the current voltage level. Any verified cells that have reached or surpassed the target threshold voltages are deselected during steps 1230. For example, as discussed above, the number of distinct possible precompensated program values for each voltage level is generally $N=L^k$. In various simplifications described herein, the number of distinct possible precompensated program values can be reduced to $N=M^k$ or even N=M.

It is again noted that the number, N, of precompenstated program voltages for a voltage level does not need to be same for all voltage levels, but each voltage level can have a distinct number N (e.g., there are at least two voltage levels for which the corresponding number of verify phases N are different).

Thus, N verify phases are applied during step 1230 after every program phase during step 1220 in order to achieve N different program voltages or target voltage thresholds for one voltage level for different cells in a page. For example, in the exemplary embodiments described herein, N is equal to two. Thus, two verify phases are applied during step 1230 after every program phase during step 1220 in order to confirm the necessary two different program voltages for each voltage level. In the exemplary embodiment, Verify 1 confirms a first target voltage threshold value, and Verify 2 confirms a second target voltage threshold value. The target voltage threshold of Verify 1 is lower than the target voltage threshold of Verify 2. Those cells that need to be programmed to the first target voltage do not need to be verified during Verify 2. On the other hand, those cells that need to be programmed to the second target voltage do not need to be verified during Verify 1. Cells that have been determined to be sufficiently programmed during the verify phases are deselected for future programming phases.

A test is performed during step 1240 to determine if all the cells that need to be programmed at the current voltage level have been programmed. If it is determined during step 1240 that all the cells have not been programmed, then program control returns to step 1220 to increment the programming pulse to further program the remaining cells to the target threshold voltages. If, however, it is determined during step 1240 that all the cells have been programmed, then program control proceeds to step 1250.

A test is performed during step 1250 to determine if there are additional voltage levels to program. If it is determined during step 1250 that there are additional voltage levels to program, then program control returns to step 1220 to program the next level. If, however, it is determined during step 1240 that all the levels have been programmed, then program control terminates in step 1260.

Figure 13:
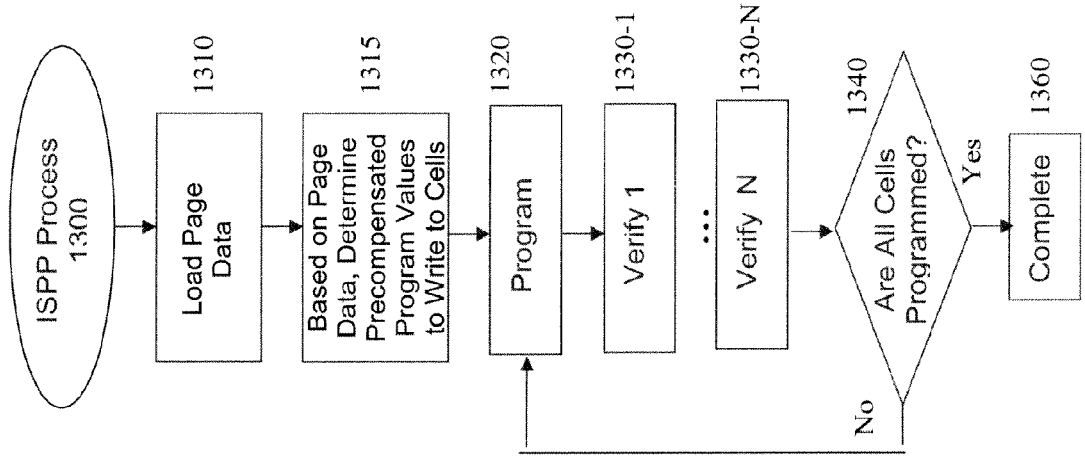
FIG. 13 is a flow chart describing an alternative ISPP process incorporating features of the present invention.

FIG. 13 is a flow chart describing an alternate implementation of an ISPP process 1300 incorporating features of the present invention. Generally, the disclosed ISPP process 1300 programs all of the voltage levels for a flash memory device in a single iteration. As shown in FIG. 13, the disclosed ISPP process 1300 initially loads the page data during step 1310, which includes data for the target and aggressor cells as described in above and in International Patent Application Serial No. PCT/US09/49327, entitled "Methods and Apparatus for Write-Side Intercell Interference Mitigation in Flash Memories," incorporated by reference herein. Based on the bits in the loaded page data, the precompensated program values are determined during step 1315 that are to be written to the cells in the flash memory device. The precompensated program values are computed in accordance with Equations (2) and (3). The selected cells are programmed with the precompensated program values for all levels during step 1320. Thereafter, a plurality, N, of verify phases are performed during steps 1330-1 through 1330-N (collectively referred to as "step 1330") to determine if the selected cells have reached the target threshold voltages. N is equal to the total number of precompensated program values to be programmed. Any verified cells, which have reached or surpassed the desired target threshold or program voltage, are deselected during steps 1330 so that they are not programmed further. It is noted that the number, N, of verify phases verified during step 1330 exceeds the number of voltage levels or data states, since at least one voltage level or data states has a plurality of program voltages. These program voltages are, for example, precompensated program values to mitigate the effect of intercell interference or other disturbance mechanisms. In the various exemplary write-side ICI cancellation techniques described herein, for example, N could equal $L \times L^k$, $L \times M^k$, or $L \times M$, since there are L level, and for each level $L^k$, $M^k$, or M precompensated program values are computed. If we consider that the erased state is typically not being programmed. N equals for example $(L-1) \times M^k$, or $(L-1) \times M$. It should be noted that L can refer to the number of levels after the final states have been programmed, for example, as shown in FIG. 5B where L equals 4, or to the number of intermediate levels as shown in FIG. 5A (where L=2) in a multi-step programming sequence.

Thus. N verify phases are applied during step 1330 after every program phase during step 1320 in order to achieve N different program voltages or target voltage thresholds, where N exceeds the number of voltage levels or data states counting the erased state since the erased state is typically not being programmed) associated with a page. For example, when the disclosed technique is applied to the programming of the LSB page of the exemplary two bits/cell flash memory described in conjunction with FIGS. 5A and 5B. N is larger than one according to the invention, while in a conventional programming method, N equals one, as only one target threshold voltage associated with state 'x0' needs to be programmed and verified. When the disclosed technique is applied to the programming of the MSB page of the exemplary 2 bits/cell flash memory described in conjunction with FIGS. 5A and 5B, N is larger than three according to the invention, while in a conventional programming method N equals three, as only three target threshold voltage associated with states '01', '00' and '10' needs to be programmed and verified. A test is performed during step 1340 to determine if all the cells have been programmed (i.e., have reached the desired target threshold voltages). If it is determined during step 1340 that all the cells have not been programmed, then program control returns to step 1320 to increment the programming pulse to program the remaining cells to their desired target threshold voltages. If, however, it is determined during step 1340 that all the cells have been programmed, then program control terminates in step 1360.

It should be noted that the disclosed programming technique using multiple verify phases can be used when final states are being programmed as shown in FIG. 5B, or when intermediate states are being programmed as shown in FIG. 5A.

Process, System and Article of Manufacture Details

While a number of flow charts herein describe an exemplary sequence of steps, it is also an embodiment of the present invention that the sequence may be varied. Various permutations of the algorithm are contemplated as alternate embodiments of the invention. While exemplary embodiments of the present invention have been described with respect to processing steps in a software program, as would be apparent to one skilled in the art, various functions may be implemented in the digital domain as processing steps in a software program, in hardware by circuit elements or state machines, or in combination of both software and hardware. Such software may be employed in, for example, a digital signal processor, application specific integrated circuit, micro-controller, or general-purpose computer. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital signal processor, a microprocessor, and a micro-controller.

As is known in the art, the methods and apparatus discussed herein may be distributed as an article of manufacture that itself comprises a computer readable medium having computer readable code means embodied thereon. The computer readable program code means is operable, in conjunction with a computer system, to carry out all or some of the steps to perform the methods or create the apparatuses discussed herein. The computer readable medium may be a recordable medium (e.g., floppy disks, hard drives, compact disks, memory cards, semiconductor devices, chips, application specific integrated circuits (ASICs)) or may be a transmission medium (e.g., a network comprising fiber-optics, the worldwide web, cables, or a wireless channel using time-division multiple access, code-division multiple access, or other radio-frequency channel). Any medium known or developed that can store information suitable for use with a computer system may be used. The computer-readable code means is any mechanism for allowing a computer to read instructions and data, such as magnetic variations on a magnetic media or height variations on the surface of a compact disk.

The computer systems and servers described herein each contain a memory that will configure associated processors to implement the methods, steps, and functions disclosed herein. The memories could be distributed or local and the processors could be distributed or singular. The memories could be implemented as an electrical, magnetic or optical memory, or any combination of these or other types of storage devices. Moreover, the term "memory" should be construed broadly enough to encompass any information able to be read from or written to an address in the addressable space accessed by an associated processor. With this definition, information on a network is still within a memory because the associated processor can retrieve the information from the network.

It is to be understood that the embodiments and variations shown and described herein are merely illustrative of the principles of this invention and that various modifications may be implemented by those skilled in the art without departing from the scope and spirit of the invention.

We claim:

1. A method for programming a flash memory device, comprising:
   programming said flash memory device for a given signal level, wherein said given signal level corresponds to a plurality of program values, and
   computing at least one of said plurality of program values for said given signal level by subtracting a cancellation term from an original program value;
   wherein said programming step comprises a programming phase and a plurality of verify phases,
   wherein at least two of said plurality of verify phases correspond to different program values for said given signal level.

2. The method of claim 1 wherein said programming step is repeated until all cells for a given signal level are programmed.

3. The method of claim 1 wherein said programming step is repeated for one or more additional signal levels.

4. The method of claim 1, wherein said verify phases further comprise the steps of reading one or more read values from said flash memory device and comparing said one or more read values to at least one threshold corresponding to one of said program values.

5. The method of claim 1, wherein each of said program values is associated with one of a plurality of groups and wherein each of said groups corresponds to a signal level.

6. The method of claim 1, wherein each of said program values is associated with one of a plurality of groups and wherein at least two of said groups comprise a different number of members.

7. The method of claim 1, wherein each of said program values is associated with one of a plurality of groups and wherein a number of said groups corresponds to a number of signal levels in said flash memory device.

8. The method of claim 1, wherein a number of said program values corresponds to a number of signal levels in said flash memory device.

9. The method of claim 1, wherein each of said program values is associated with one of a plurality of groups and wherein one of said groups comprises a first set of cells programmed to a first signal level and a second set of cells programmed to a second signal level.

10. The method of claim 9, wherein said first signal level has a first corresponding threshold for a first of said verify phases and wherein said second signal level has a second corresponding threshold for a second of said verify phases.

11. The method of claim 1, further comprising the step of excluding one or more cells from a given one of said verify phases if a program value associated with said given verify phase does not apply to said excluded one or more cells.

12. The method of claim 1, further comprising the step of excluding one or more cells from a further one of said verify phases if said excluded one or more cells pass one of said verify phases.

13. The method of claim 1, wherein said plurality of program values comprise program values that precompensate for one or more of intercell interference, back pattern dependency, program disturb, read disturb and additional noise.

14. The method of claim 1, wherein said plurality of program values correspond to precompensated program values that compensate for disturbance.

15. The method of claim 14, wherein said disturbance comprises intercell interference from at least one aggressor cell.

16. The method of claim 15, wherein a number of said program values corresponds to $L^k$, where L is a number of different $\Delta V_t(l)$ values, $\Delta V_t(l)$ is a change in a $V_t$ voltage of a cell and k is a number of considered aggressor cells.

17. The method of claim 15, wherein a number of said program values corresponds to $M^k$, where k is a number of considered aggressor cells and M is the number of distinct voltage shifts that are considered.

18. The method of claim 15, wherein a number of program values corresponds to M, where M is the number of distinct voltage shifts that are considered.

19. The method of claim 1, wherein said flash memory device is programmed using one or more of a page access technique and a wordline level access technique.

20. The method of claim 15, wherein said at least one aggressor cell comprises one or more cells adjacent to a target cell.

21. The method of claim 14, wherein said precompensated program values are obtained from an interface for writing in said flash memory device.

22. The method of claim 14, wherein said precompensated program values are computed by a processor associated with said flash memory device.

23. The method of claim 14, wherein said precompensated program values are computed by a processor associated with a flash memory controller.

24. The method of claim 1, wherein said programming of at least two of said signal levels can have a different number of said verify phases.

25. The method of claim 1, wherein one or more of said signal level and said program value are represented using one or more of a voltage, a current and a resistance.

26. A system for programming a flash memory device, comprising:
    a memory; and
    at least one processor, coupled to the memory, operative to:
    program said flash memory device for a given signal level, and
    compute at least one of said plurality of program values for said given signal level by subtracting a cancellation term from an original program value;
    wherein said given signal level corresponds to a plurality of program values,
    wherein said programming step comprises a programming phase and a plurality of verify phases,
    wherein at least two of said plurality of verify phases correspond to different program values for said given signal level.

27. The system of claim 26 wherein said programming is repeated until all cells for a given signal level are programmed.

28. The system of claim 26 wherein said programming is repeated for one or more additional signal levels.

29. The system of claim 26, wherein said verify phases further comprise reading one or more read values from said flash memory device and comparing said one or more read values to at least one threshold corresponding to one of said program values.

30. The system of claim 26, wherein each of said program values is associated with one of a plurality of groups and wherein each of said groups corresponds to a signal level.

31. The system of claim 26, wherein each of said program values is associated with one of a plurality of groups and wherein at least two of said groups comprise a different number of members.

32. The system of claim 26, wherein each of said program values is associated with one of a plurality of groups and wherein a number of said groups corresponds to a number of signal levels in said flash memory device.

33. The system of claim 26, wherein a number of said program values corresponds to a number of signal levels in said flash memory device.

34. The system of claim 26, wherein each of said program values is associated with one of a plurality of groups and wherein one of said groups comprises a first set of cells programmed to a first signal level and a second set of cells programmed to a second signal level.

35. The system of claim 34, wherein said first signal level has a first corresponding threshold for a first of said verify phases and wherein said second signal level has a second corresponding threshold for a second of said verify phases.

36. The system of claim 26, wherein said at least one processor is further configured to exclude one or more cells from a given one of said verify phases if a program value associated with said given verify phase does not apply to said excluded one or more cells.

37. The system of claim 26, wherein said at least one processor is further configured to exclude one or more cells from a further one of said verify phases if said excluded one or more cells pass one of said verify phases.

38. The system of claim 26, wherein said plurality of program values comprise program values that precompensate for one or more of intercell interference, back pattern dependency, program disturb, read disturb and additional noise.

39. The system of claim 26, wherein said plurality of program values correspond to precompensated program values that compensate for disturbance.

40. The system of claim 39, wherein said disturbance comprises intercell interference from at least one aggressor cell.

41. The system of claim 40, wherein a number of said program values corresponds $L^k$, where L is a number of different $\Delta V_t(l)$ values, $\Delta V_t(l)$ is a change in a $V_t$ voltage of a cell and k is a number of considered aggressor cells.

42. The system of claim 40, wherein a number of said program values corresponds to $M^k$, where k is a number of considered aggressor cells and M is the number of distinct voltage shifts that are considered.

43. The system of claim 40, wherein a number of program values corresponds to M, where M is the number of distinct voltage shifts that are considered.

44. The system of claim 26, wherein said flash memory device is programmed using one or more of a page access technique and a wordline level access technique.

45. The system of claim 40, wherein said at least one aggressor cell comprises one or more cells adjacent to a target cell.

46. The system of claim 39, wherein said precompensated program values are obtained from an interface for writing in said flash memory device.

47. The system of claim 39, wherein said precompensated program values are computed by a processor associated with said flash memory device.

48. The system of claim 39, wherein said precompensated program values are computed by a processor associated with a flash memory controller.

49. The system of claim 26, wherein said programming of at least two of said signal levels can have a different number of said verify phases.

50. The system of claim 26, wherein one or more of said signal level and said program value are represented using one or more of a voltage, a current and a resistance.

* * * * *